United States Patent [19]

Sato

[11] Patent Number: 5,008,955
[45] Date of Patent: Apr. 16, 1991

[54] RECEIVERS WITH MICROCOMPUTER CONTROLLED TUNING

[75] Inventor: Kazuhiro Sato, Tokyo, Japan
[73] Assignee: Sony Corporation, Tokyo, Japan
[21] Appl. No.: 269,143
[22] PCT Filed: Feb. 25, 1988
[86] PCT No.: PCT/JP88/00197
 § 371 Date: Oct. 25, 1988
 § 102(e) Date: Oct. 25, 1988
[87] PCT Pub. No.: WO88/06820
 PCT Pub. Date: Sep. 7, 1988

[30] Foreign Application Priority Data

Feb. 26, 1987 [JP] Japan .................. 62-43433

[51] Int. Cl.$^5$ .................................. H04B 1/10
[52] U.S. Cl. .......................... 455/181; 455/310
[58] Field of Search ............. 455/343, 181, 103, 192, 455/259, 260, 316, 317, 310; 381/13

[56] References Cited

U.S. PATENT DOCUMENTS

| | | | |
|---|---|---|---|
| 4,276,654 | 6/1981 | Nations et al. | 455/160 |
| 4,281,349 | 7/1981 | George | 455/343 |
| 4,301,540 | 11/1981 | Sato et al. | 455/343 |
| 4,384,361 | 5/1983 | Masaki | 455/343 |
| 4,592,078 | 5/1986 | Yamada | 455/343 |

FOREIGN PATENT DOCUMENTS 57-195257 12/1982 Japan .
57-206142 12/1982 Japan .
58-191749 12/1983 Japan .

Primary Examiner—Reinhard J. Eisenzopf
Assistant Examiner—Edward Urban
Attorney, Agent, or Firm—Hill, Van Santen, Steadman & Simpson

[57] ABSTRACT

The present invention relates to a receiver which selects a station relying upon station selecting data delivered from a microcomputer and particularly to a receiver which can increase an S/N ratio during the reception. According to an embodiment of the present invention, there is provided a receiver which comprises a microcomputer for producing station selecting data and a clock signal, a tuning circuit supplied with the above-mentioned station selecting data synchronized with the clock signal and which is tuned to a desired broadcasting frequency, a detecting circuit for detecting whether or not the tuning circuit is selecting a station and a switching circuit which automatically stops the generation of the clock signal from the microcomputer by the output from the detecting circuit when the station selecting operation of the tuning circuit is finished.

6 Claims, 4 Drawing Sheets

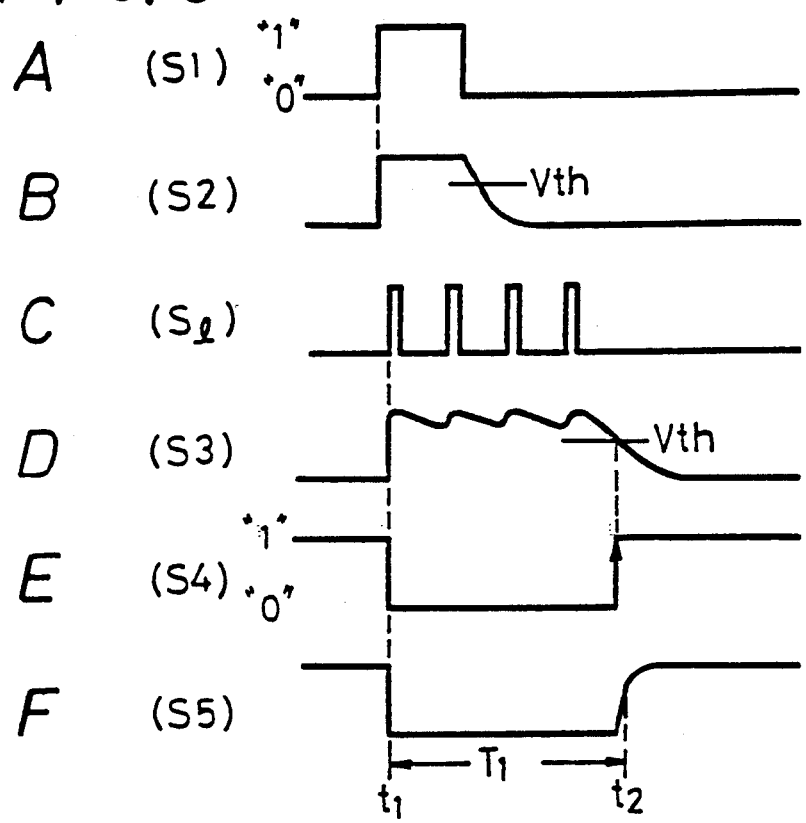
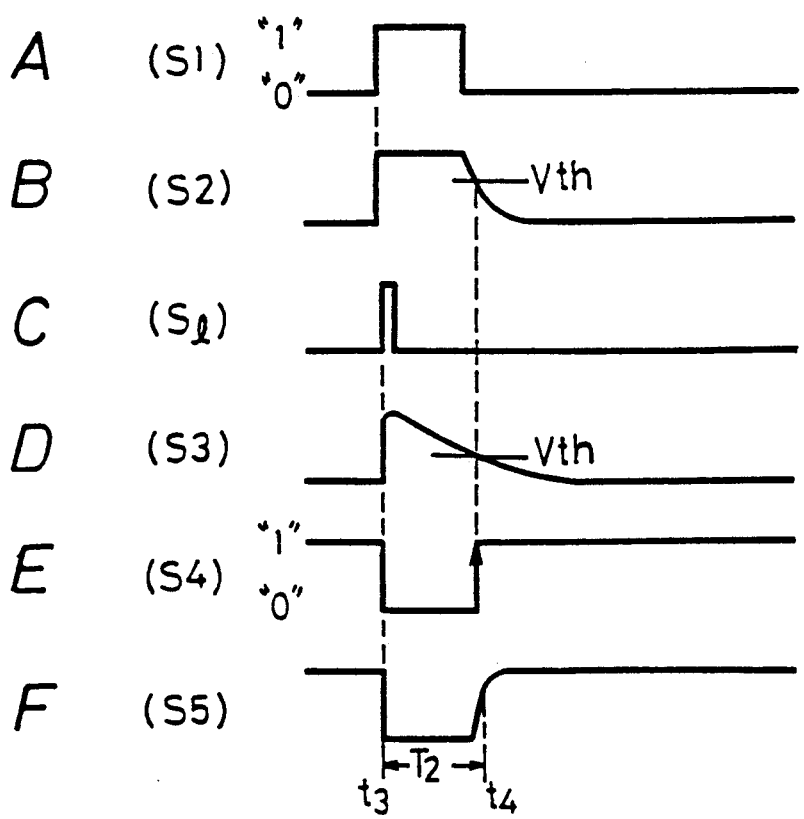

RECEIVERS WITH MICROCOMPUTER CONTROLLED TUNING

DESCRIPTION

1. Technical Field

The present invention relates to a receiver which selects a station relying upon station selecting data produced from a microcomputer and more particularly to a receiver which can increase an S/N ratio during the reception by automatically stopping the operation of a clock pulse generator in the microcomputer when the station selecting operation is finished.

2. Background Art

An example of an FM radio receiver in the prior art shown in FIG. 1 will be described.

Referring to the same figure, an FM broadcast signal (in a range of 76 to 90 MHz in Japan) received at an antenna 1 is supplied to a front end 2. An intermediate frequency signal delivered from the front end 2 is supplied through an intermediate frequency amplifier 3 to an FM detector 4. A stereo mixed-wave signal delivered from the FM detector 4 is supplied to a stereo multiplex decoder (stereo demodulator) 5 by which left- and -right audio signals are developed at output terminals 6L and 6R led out from the stereo multiplex decoder 5, respectively.

Reference numeral 7 denotes a PLL (phase-locked loop) circuit. As is well known (not shown in detail), a local oscillation signal Fout from the front end 2 is divided by N in a -1/N frequency-divider provided within the PLL circuit 7 and compared with a reference oscillation signal. The compared error signal therefrom is supplied through a low-pass filter to the front end 2 as a tuning control voltage Vt. Reference numeral 8 designates a controller that might be formed of a microcomputer. The fact that the dividing ratio of the 1/N frequency-divider in the PLL circuit 7 can be controlled by the controller 8 is carried out by using the system disclosed in U.S. Pat. No. 4592078 "UP/DOWN COUNTER CONTROL CIRCUIT" and such a control operation therefore need not be described in detail. The controller 8 is connected with a crystal oscillator 9 forming a clock signal generator which generates a clock signal with frequency of several MHz, for example, 4 MHz. One and the other ends of the crystal oscillator 9 are grounded via capacitors 10 and 11, respectively. A key input apparatus 12 is connected to the controller 8, and a station selection or the like is carried out by operating the key switch of the key input apparatus 12. When a station is selected, the controller 8 supplies data indicative of N for the frequency-dividing ratio 1/N to the PLL circuit 7, thus changing the frequency-dividing ratio 1/N to select the station. In practice, the data indicative of N corresponding to the receiving frequency is supplied from the controller 8 to the PLL circuit 7 in synchronism with the clock signal. After data N of predetermined bits is transferred, a latch signal is supplied thereto so that the data N is latched to a data register connected to the 1/N frequency-divider in the PLL circuit 7, thus the frequency-dividing ratio 1/N being changed to select the station.

A display apparatus 13 is connected to the controller 8, and the display apparatus 13 is supplied with display data when a station is selected and so on. The display displays a channel of a station selected or the like. In practice, display data is supplied from the controller 8 to the display apparatus 13 in synchronism with the clock signal and the latch signal is finally supplied thereto, whereby the display apparatus 13 latches and displays the display data.

The controller 8 supplies a switching signal of, for example, narrow band and wide band to the intermediate frequency amplifier 3 so that the band width thereof is controlled.

In the FM radio receiver of the example shown in FIG. 1, during the reception, the controller 8 successively generates clock signals so that the harmonic componets of the 4 MHz clock signal are supplied to the front end 2. There is a risk that a beat interference with the receiving frequency will be caused. To avoid such a defect, in the art there is such a limitation or the like that a substrate for a signal system and a substrate for a digital system such as the microcomputer or the like have to be spaced apart from each other. Further, there is such a problem that a power source voltage is fluctuated by the clock signal and the fluctuated component of the power source voltage is contained in the output audio signal as a noise, thus a sound quality being deteriorated.

DISCLOSURE OF INVENTION

In view of the above aspects, the present invention intends to improve an S/N ratio during the reception and to increase freedom with which substrates or the like may be located and so on.

According to an embodiment of the present invention, there are provided a judging circuit which judges, based upon station selecting data, display data and so on from a microcomputer 8, whether the receiver is selecting a station or not and a switching circuit. When the station selecting operation is finished, the output signal from the judging circuit controls the switching circuit to automatically stop the operation of the clock generator in the microcomputer 8.

Therefore, according to the thus made arrangement, since the generation of clock signals from the microcomputer 8 is automatically stopped when the station selection opration is finished, the generation of clock signals is stopped during the reception. Thus, it is possible to provide a receiver in which upon reception, the harmonic components of the clock signal can be avoided from being supplied to the front end 2 with no beat interference. Also, the power source voltage can be prevented from being fluctuated by the clock signal.

BRIEF DESCRIPTION OF DRAWINGS

FIGS. 3 and 4 are waveform diagrams used to explain the embodiment.

BEST MODE FOR CARRYING OUT THE INVENTION

Figure 1:
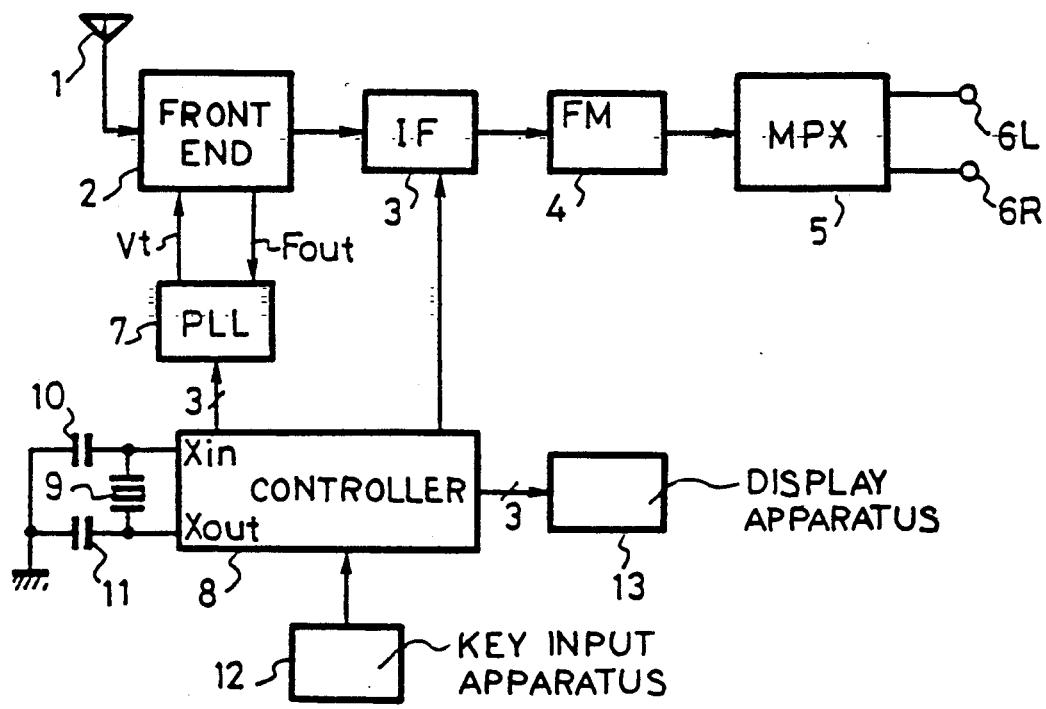
FIG. 1 is a block diagram showing an example of the prior art.
Figure 2:
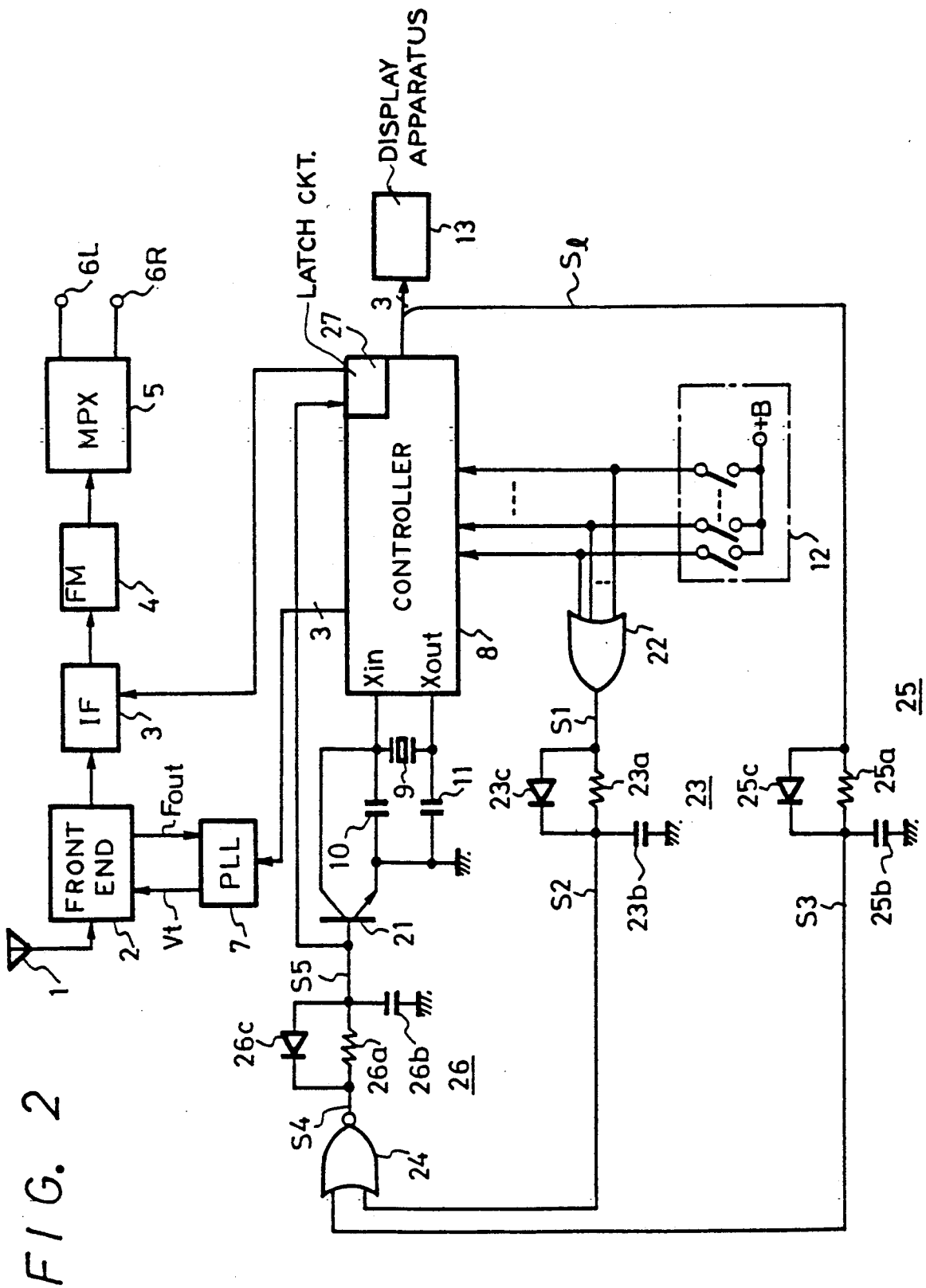
FIG. 2 is a block diagram showing an embodiment of the present invention.
Figure 6:
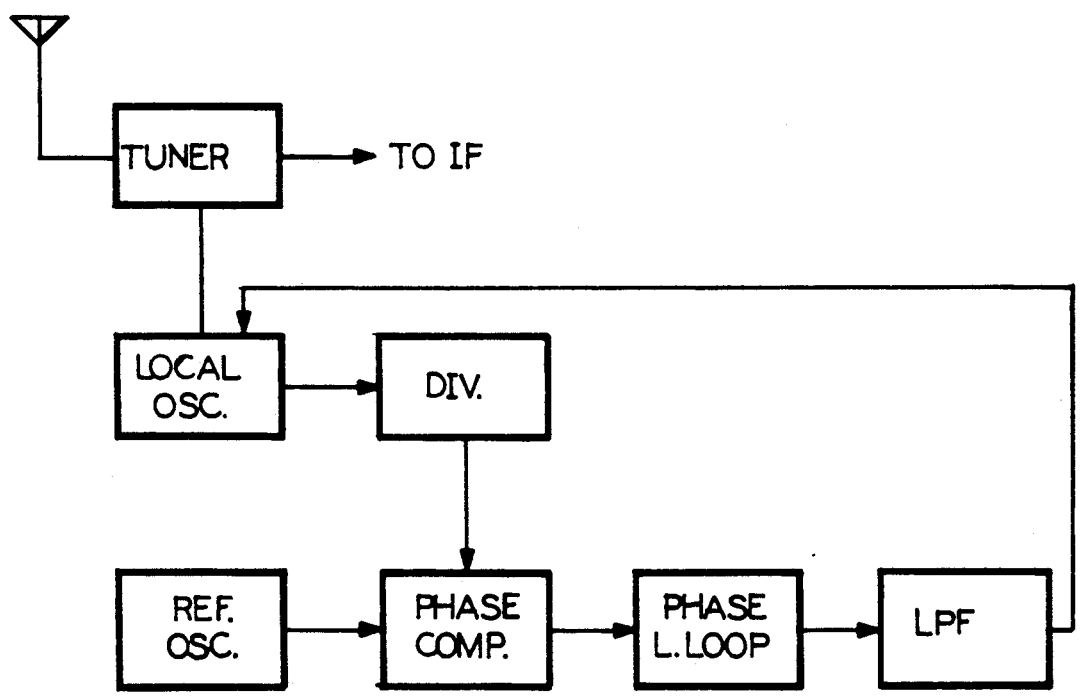

An embodiment of the present invention will hereinafter be described with reference to FIG. 2. In FIG. 2, like parts corresponding to those of FIG. 1 are marked with the same references and therefore need not be described in detail.

Referring to the same figure, a junction between the crystal oscillator 9 forming the clock oscillator and the capacitor 10 is connected to the collector of an NPN transistor 21 for switching operation. The emitter of the transistor 21 is grounded.

The key input apparatus 12 has a plurality of key switches which are respectively connected to the controller 8 at their one ends. The other ends thereof are connected to a voltage terminal +B.

The one ends of the respective key switches of the key input apparatus 12 are connected to the input side of an OR circuit 22. The output side of the OR circuit 22 is grounded via a series circuit of a resistor 23a and a capacitor 23b forming an integrator 23. Reference numeral 23c designates a speed-up diode that is connected in parallel to the resistor 23a. The output side of the integrator 23, i.e., the junction between the resistor 23a and the capacitor 23b is connected to the input side of a NOR circuit 24.

A latch signal Sλ supplied from the controller 8 to the display apparatus 13 is grounded via a series circuit of a resistor 25a and a capacitor 25b forming an integrator 25. Reference numeral 25c designates a speed-up diode that is connected to the resistor 25a in a parallel relation. The the resistor 25a and the capacitor 25b is connected to the input side of the NOR circuit 24.

The output side of the NOR circuit 24 is grounded via a series circuit of a resistor 26a and a capacitor 26b forming an integrator 26. Reference numeral 26c designates a speed-up diode that is connected to the resistor 26a in a parallel relation. The output side of the integrator 26 is connected to the base of the transistor 21.

The signal produced at the output side of the integrator 26 is supplied, as a latch signal, to a latch circuit 27 which latches data to be supplied to the intermediate frequency amplifier 3 and the latch circuit carries out the latch operation at a timing changing from low level "0" to high level "1".

Other elements are formed similarly to those of the example of FIG. 1.

In this embodiment, a station is selected by operating a channel up-key or channel down-key of, for example, the key input apparatus 12 and this operation will be described.

When the channel up-key or channel down-key is depressed, an output signal S1 from the OR circuit 22 goes to high level "1" during the period in which the channel up-key or channel down-key is depressed, as shown in FIG. 3A so that an output signal S2 from the integrator 23 is changed as shown in FIG. 3B. Also, when the channel up-key or channel down-key is depressed, the controller 8 continuously supplies data N to the PLL circuit 7, thus changing the dividing ratio, 1/N to select stations sequentially.

At that time, the controller 8 continuously supplies display data to the display apparatus 13 which displays the channel of the selected station sequentially. To this end, 143 the latch signal Sλ supplied from the controller 8 to the display apparatus 13 is produced a plurality of times successively. In the illustrated case, the latch signal is produced four times. When the latch signal Sλ is produced a plurality of times successively, the output signal S3 of the integrator 25 is changed as shown in FIG. 3D. Accordingly, Vth assumes a threshold value of the NOR circuit 24. Then, the output signal S4 from the NOR circuit 24 is presented as shown in FIG. 3E, and the output signal S5 of the integrator 26 is changed as shown in FIG. 3F.

Consequently, the transistor 21 is turned OFF during the period T1 from a time point t1 where the channel up-key or channel down-key is depressed to a time point t2 immediately after the station selecting operation is finished so that the clock generator continues its operation. On the other hand, during other period, the transistor 21 is turned ON to allow the one end of the crystal oscillator 9 to be grounded so that the clock generator stops operating.

Further, since at time point t2 the output signal S5 of the integrator 26 changes from low level "0" to high level "1", the latch operation of the latch circuit 27 is performed at this time point t2, preventing the data to the intermediate amplifier 3 from being changed during the period in which the generation of the clock signal is stopped.

In this embodiment, such a case where, for example, a preset key of the key input apparatus 12 is depressed will be explained.

In this case, if the preset key is depressed, the output signal S1 of the OR circuit 22 goes to high level "1"only during the period in which the preset key is being pressed as shown in FIG. 4A so that the output signal S2 from the integrator 23 is changed as shown in FIG. 4B. If the preset key is depressed, the controller 8 supplies the preset data N to the PLL circuit 7, thus changing the dividing ratio 1/N to select the station of the thus preset channel.

At that time, display data is supplied from the controller 8 to the display apparatus 13 which displays the channel of the selected station. To this end, only one latch signal Sλ is supplied from the controller 8 to the display apparatus 13 as shown in FIG. 4C. When the latch signal Sλ is produced as described above, the output signal S3 of the integrator 25 is changed as shown in FIG. 4D. As a result, Vth assumes the threshold value of the NOR circuit 24. Then, the output signal S4 of the NOR circuit 24 is presented as shown in FIG. 4E so that the output signal S5 of the integrator 26 is changed as shown in FIG. 4F.

Accordingly, the transistor 21 is turned OFF during the period T2 from a time point t3 where the preset key is depressed to a time point t4 just after the station selecting operation is finished so that the operation of the clock generator is continued. During other period, the transistor 21 is turned ON so that one end of the crystal oscillator 9 is grounded, thus the operation of the clock generator being stopped.

Since at time point t4 the output signal S5 of the integrator 26 is changed from low level "0" to high level "1", the latch circuit 27 performs the latch operation at this time point t4.

According to this embodiment, when other key switch of the key input apparatus 12 is depressed, the switching transistor 21 is turned OFF during a certain period of time from a time point where other key switch is depressed so that the generation of the clock signal is continued, thus the controller 8 being operated without trouble.

According to this embodiment as described above, when the station selecting operation is ended, the generation of the clock signals from the controller 8 is automatically stopped so that during the reception, the generation of the clock signal is stopped. Accordingly, upon reception, the harmonic components of the clock signal can be avoided from being supplied to the front end 2 and the beat interference can be avoided. Thus, such a limitation or the like that the substrate for the signal system and the substrate for the digital system do not have to be spaced apart from each other is unnecessary, increasing the freedom in designing the receiver.

Further, since upon reception the generation of the clock signal is stopped, the power source voltage can be prevented from being fluctuated by the clock signal, thus to avoid such a fluctuated component from being contained in the output audio signal as a noise. Hence, the sound quality (S/N ratio) can be improved.

Figure 5:
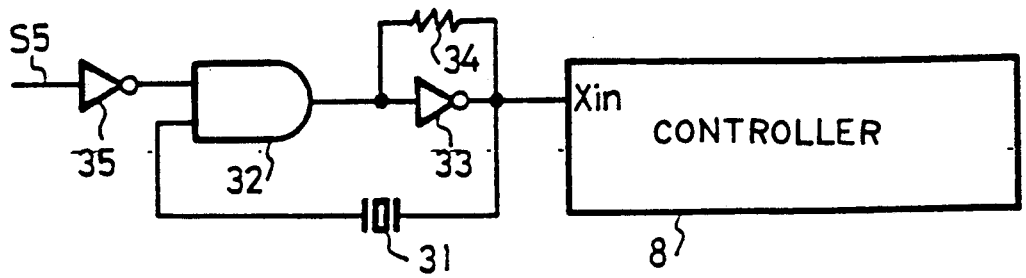
FIG. 5 is a diagram showing another embodiment of the present invention and FIG. 6 is a diagram of the tuning circuitry.

FIG. 5 illustrates another embodiment of the present invention.

In the same figure, reference numeral 31 designates a crystal oscillator that forms a clock oscillator. One end of this crystal oscillator 31 is connected to the input side of an AND circuit 32 and the other end thereof is connected to the controller 8. The output side of the AND circuit 32 is connected to the other end of the crystal oscillator 31 via an inverter 33. A resistor 34 is connected to the inverter 33 in parallel. The output signal S5 from the integrator 26 is supplied through an inverter 35 to the AND circuit 32.

This embodiment is constructed as described above and though not shown other elements are formed the same as those of the embodiment shown in FIG. 2.

Also in this embodiment, when the output signal S5 goes to low level (see the period T1 in FIG. 3 and the period T2 in FIG. 4), the output signal from the inverter 35 goes to high level "1" so that the generation of the clock signal is continued. When on the other hand the output signal S5 goes to high level "1", the output signal from the inverter 35 goes to low level "0" so that the generation of the clock signal is stopped.

As described above, also in this embodiment, when the station selecting operation is finished (see time point t2 in FIG. 3 and time point t4 in FIG. 4), the generation of the clock signal from the controller 8 is automatically stopped with action and effects similar to those of the embodiment of FIG. 2 being achieved.

In the above-mentioned embodiment, the latch circuit 27 is adapted to prevent the data to the intermediate frequency amplifier 3 from being changed when the generation of the clock signal is stopped. This latch circuit is not need by a receiver in which this data is stored in a memory and cannot be changed. While the latch signal supplied from the controller 8 to the display apparatus 13 is utilized effectively in the above-mentioned embodiments, it is possible to utilize a latch signal supplied from the controller 8 to the PLL circuit 7. Further, such a variant is possible that the microcomputer itself detects that the transfer of the station selecting data is finished and stops the generation of the clock signal. While in the above-mentioned embodiments the present invention is applied to the FM radio receiver, the present invention can be similarly applied to an AM radio receiver, a television receiver or the like.

According to the present invention as set forth above, when the station selecting operation is finished, the generation of the clock signals from the microcomputer is automatically stopped and upon reception, the generation of the clock signal is stopped. Therefore, during the reception, it is possible to avoid that the beat interference is caused by the input of the harmonic components of the clock signal. There is then an advantage that the substrates and the like can be located with increased freedom. Also, during the reception, the power source voltage can be prevented from being fluctuated by the clock signal and the noise caused by such a fluctuation can be avoided.

I claim:

1. A receiver having an IF stage and characterized by a microcomputer for generating station selecting data and a clock signal, said microcomputer having a latch means for storing data supplied to said IF stage for controlling the bandwidth theses, tuning means supplied with said station selecting data in synchronism with said clock signal and which is tuned to a desired broadcasting frequency, said IF stage being connected to said tuning means to receive the output of said tuning means and connected to said latch means to receive data from said microcomputer, a detecting circuit for detecting whether said tuning means is selecting a station or not and a switching circuit which automatically stops the generation of said clock signal from said microcomputer based on the output from said detecting circuit when the station selecting operation of said tuning means is finished, and means responsive to operation of said detecting circuit and connected to said latch means to prevent the data in said latch means for changing during the period in which generation of said clock signal is stopped.

2. A receiver according to claim 1, characterized in that said tuning means comprises a 1/N frequency-divider supplied with an output signal of a local oscillator, a phase comparator for phase-comparing the output divided by said 1/N frequency-divider and an output signal of a reference oscillator, and a phase-locked loop for supplying an error signal from said phase comparator through a low-pass filter to said local oscillator as a tuning control voltage, wherein said station selecting data is latched to control the dividing ratio of said 1/N frequency-divider.

3. A receiver according to claim 2, characterized in that said detecting circuit is formed of a voltage detecting circuit which detects a voltage changed by depressing a key of a key input apparatus of said microcomputer.

4. A receiver according to claim 3, characterized in that said microcomputer includes a clock signal generating circuit formed of a crystal oscillator connected between input and output terminals of an inverter and said switching circuit is connected between one end of said crystal oscillator and a reference potential point.

5. A receiver according to claim 2, characterized in that said detecting circuit includes an integrator which integrates a latch signal for latching display data supplied from said microcomputer to display means, wherein an output voltage from said integrator is compared with a reference voltage to detect whether or not a station is being selected.

6. A receiver according to claim 2, characterized in that said detecting circuit detects that the transfer of said station selecting data to said 1/N frequency-divider in said phase-locked loop is finished by said microcomputer.

* * * * *